United States Patent
Zhang et al.

(10) Patent No.: US 9,632,428 B2
(45) Date of Patent: Apr. 25, 2017

(54) METHOD OF DETERMINING DEVICE TYPE AND DEVICE PROPERTIES AND SYSTEM OF PERFORMING THE SAME

(71) Applicant: TAIWAN SEMICONDUCTOR MANUFACTURING COMPANY, LTD., Hsinchu (TW)

(72) Inventors: Ya-Min Zhang, Shanghai (CN); Mu-Jen Huang, Taipei (TW); Ming Feng, Shanghai (CN); Peng-Sheng Chen, Shanghai (CN); Li-Qun Sun, Shanghai (CN)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 64 days.

(21) Appl. No.: 14/607,710

(22) Filed: Jan. 28, 2015

(65) Prior Publication Data
US 2015/0294040 A1  Oct. 15, 2015

(30) Foreign Application Priority Data

Apr. 15, 2014 (CN) .......................... 2014 1 0152132

(51) Int. Cl.
*G03F 7/20* (2006.01)
*G06F 17/50* (2006.01)
(Continued)

(52) U.S. Cl.
CPC .......... *G03F 7/70433* (2013.01); *G06F 17/24* (2013.01); *G06F 17/5004* (2013.01);
(Continued)

(58) Field of Classification Search
CPC .... G06F 17/505; G06F 17/24; G06F 17/5004; G06F 17/5009; G06F 17/5068;
(Continued)

(56) References Cited

U.S. PATENT DOCUMENTS 6,496,957 B1 * 12/2002 Kumagai ................ G06F 17/50
716/112
6,606,735 B1 * 8/2003 Richardson ......... G06F 17/5081
716/112
(Continued)

*Primary Examiner* — Helen Rossoshek
(74) *Attorney, Agent, or Firm* — Hauptman Ham, LLP

(57) ABSTRACT

A method of determining a device type and device properties includes receiving an input file including information related to a device, and identifying at least one layer set within the input file. The method further includes identifying at least one feature present in layer set. The method further includes analyzing a relationship between the at least one feature formed by the first layer and at least one feature formed by the second layer to determine at least one layer set relationship. The method further includes comparing the layer set relationship with at least one template layer set relationship. The method further includes determining the device type of the device based on the comparison between the layer set relationship and the template layer set relationship. The method further includes determining the device properties of the device based on the layer set relationship, the device type or the at least one feature.

20 Claims, 4 Drawing Sheets

(51) Int. Cl.
*G06F 17/24* (2006.01)
*H01L 27/146* (2006.01)

(52) U.S. Cl.
CPC ........ *G06F 17/505* (2013.01); *G06F 17/5009* (2013.01); *G06F 17/5068* (2013.01); *G06F 17/5077* (2013.01); *G06F 17/5081* (2013.01); *H01L 27/14601* (2013.01)

(58) Field of Classification Search
CPC ............. G06F 17/5077; G06F 17/5081; H01L 27/14601; H01L 31/05; H01L 51/52
See application file for complete search history.

(56) References Cited

U.S. PATENT DOCUMENTS

| | | | | |
|---|---|---|---|---|
| 6,691,296 B1* | 2/2004 | Nakayama | ......... | G06F 17/5036 716/122 |
| 7,243,317 B2* | 7/2007 | Wang | ................. | G06F 17/5081 716/112 |
| 7,464,350 B1* | 12/2008 | Ho | ...................... | G06F 17/5081 703/13 |
| 8,601,416 B2 | 12/2013 | Kuo et al. | | |
| 8,645,876 B2* | 2/2014 | Loh | .................... | G06F 17/5081 716/50 |
| 8,645,900 B2* | 2/2014 | Schroeder | .................... | 716/104 |
| 8,762,900 B2 | 6/2014 | Shin et al. | | |
| 8,769,460 B1* | 7/2014 | Hawkins | ............. | G06F 17/5081 716/106 |
| 8,775,993 B2 | 7/2014 | Huang et al. | | |
| 8,887,116 B2 | 11/2014 | Ho et al. | | |
| 9,147,034 B1* | 9/2015 | Hawkins | ............. | G06F 17/5081 |
| 2005/0223347 A1* | 10/2005 | Okuaki | ............... | G06F 17/5081 716/52 |
| 2006/0168551 A1* | 7/2006 | Mukuno | ............. | G06F 17/5077 716/106 |
| 2006/0271903 A1* | 11/2006 | Hamazaki | ........... | G06F 17/5068 716/119 |
| 2009/0039520 A1* | 2/2009 | Tanaka | ................ | G06F 17/5077 257/773 |
| 2010/0204962 A1* | 8/2010 | Choudhary | ......... | G06F 17/5004 703/1 |
| 2011/0167399 A1* | 7/2011 | Schroeder | ........... | G06F 17/5045 716/122 |
| 2011/0252391 A1* | 10/2011 | Arimoto | ............. | G06F 17/5045 716/113 |
| 2012/0054229 A1* | 3/2012 | Nomura | ................. | G06F 17/505 707/769 |
| 2013/0074016 A1* | 3/2013 | Loh | ..................... | G06F 17/5081 716/52 |
| 2013/0074024 A1* | 3/2013 | Chase | ................. | G06F 17/5081 716/112 |
| 2014/0040839 A1* | 2/2014 | Reber | ................. | G06F 17/5081 716/55 |
| 2014/0101623 A1 | 4/2014 | Chen et al. | | |
| 2014/0201692 A1 | 7/2014 | Chen et al. | | |
| 2014/0237435 A1 | 8/2014 | Chen et al. | | |
| 2014/0282337 A1 | 9/2014 | Yuh et al. | | |
| 2014/0304670 A1 | 10/2014 | Su et al. | | |
| 2014/0310675 A1 | 10/2014 | Liu et al. | | |
| 2014/0325464 A1 | 10/2014 | Hsu et al. | | |
| 2016/0140267 A1* | 5/2016 | Chen | ....................... | G03F 7/705 716/55 |

\* cited by examiner

METHOD OF DETERMINING DEVICE TYPE AND DEVICE PROPERTIES AND SYSTEM OF PERFORMING THE SAME

PRIORITY CLAIM

The present application claims the priority of China application no. 201410152132.6, filed Apr. 15, 2014, which is incorporated herein by reference in its entirety.

BACKGROUND

In general a device is defined by a plurality of layer feature compositions in accordance with sort of properties and relationships, in which the definition is represented by a sample graphical layout file and several description files. A sample device is to reflect its physical composition and structure fabricated onto the wafer, therefore is regarded as a golden reference throughout the design and manufacturing processes, for example, a DRC (design rule check) used for detect the design rule violation according to the device property, or a LVS (layout versus schematic) used for identifying a device connectivity and checking against the schematic. However, the sample layout and description files are manually processed and may be wrongly interpreted, which would resulted in a series of fatal misoperation throughout the whole IC manufacturing.

Based on the manual inspection, the deck, e.g., DRC deck, and script, e.g., pcell layout synthesizing, used in the IC design processes can be created accordingly for ensuring the product produced meets the intended product of the customer. As device designs become more complex, additional layers and features are included in device specifications. The increase in features and layers in a device increases the complexity in determining the device type and properties. As a number of device types increases, the deck and script creators refer to many different reference files in order to determine the device type and properties.

In instances where the deck and script creator inaccurately determines a device type or device property, a product is either re-worked or wasted. If the deck or script creator inaccurately determines the device type or the device property, the device specifications are again reviewed manually to identify and correct the error.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
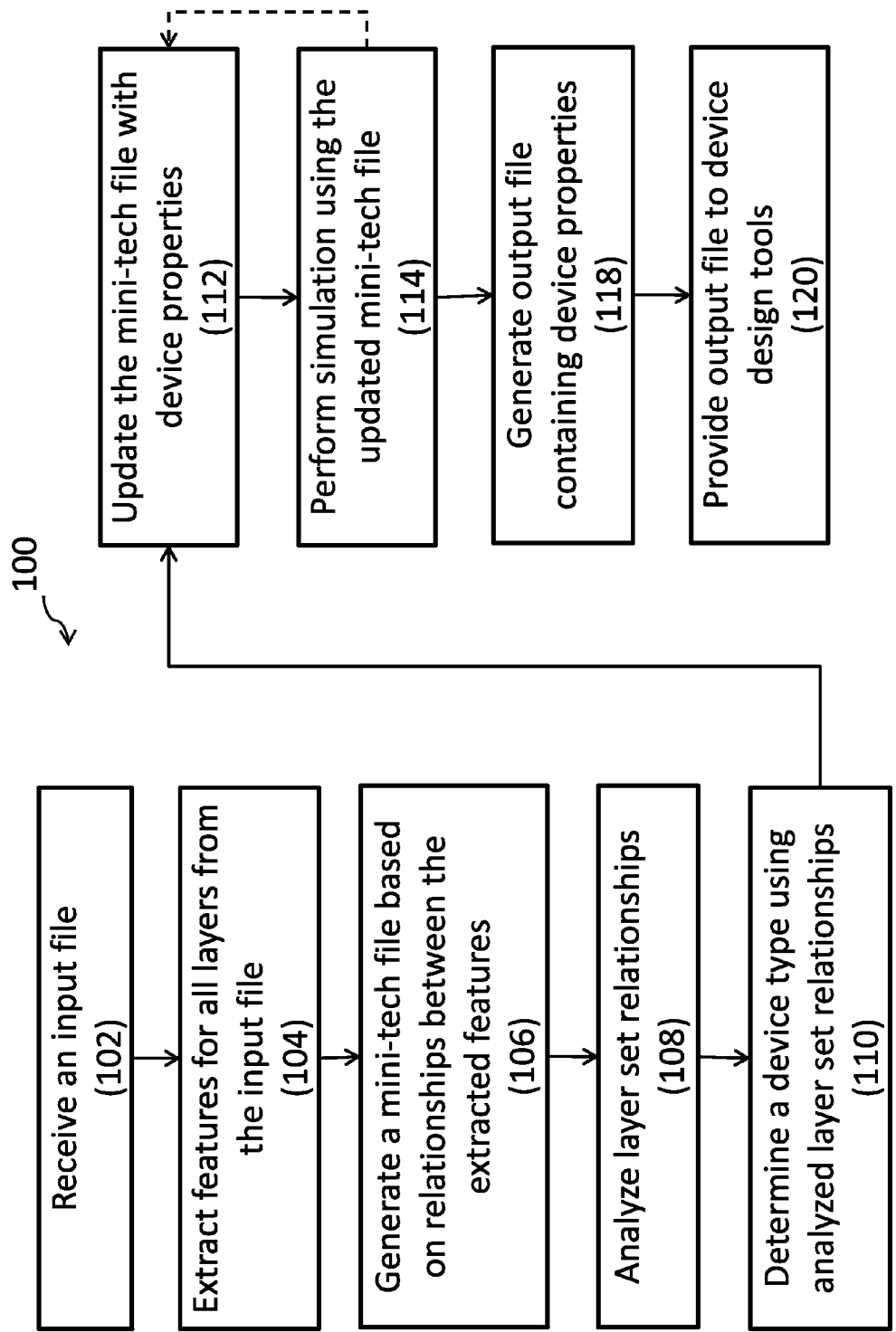
FIG. 1 is a flow chart of a method of extracting device type and properties, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method 100 of extracting device type and properties, in accordance with some embodiments. Method 100 begins with operation 102 in which an input file is received. The input file includes specification of several features used to form a device. The features are arranged across one or more layers of the device. In some embodiments, multiple features are present in a same layer. In some embodiments, an interface of separate features exists at a surface of a layer. In some embodiments, a layer of the device is defined by depth of the feature in a wafer or substrate or a height of the feature above the wafer or substrate. In some embodiments, a layer of the device is defined by a pre-determined depth into the wafer or substrate or a predetermined height above the wafer or substrate. In some embodiments, the input file is a graphic file. In some embodiments, the input file is a graphic design system (GDS) file or an open artwork system interchange standard (OASIS) file. In some embodiments, the input file identifies the layers of the device. In some embodiments, the layers of the device are identified using a processor associated with a general computing device.

Figure 2:
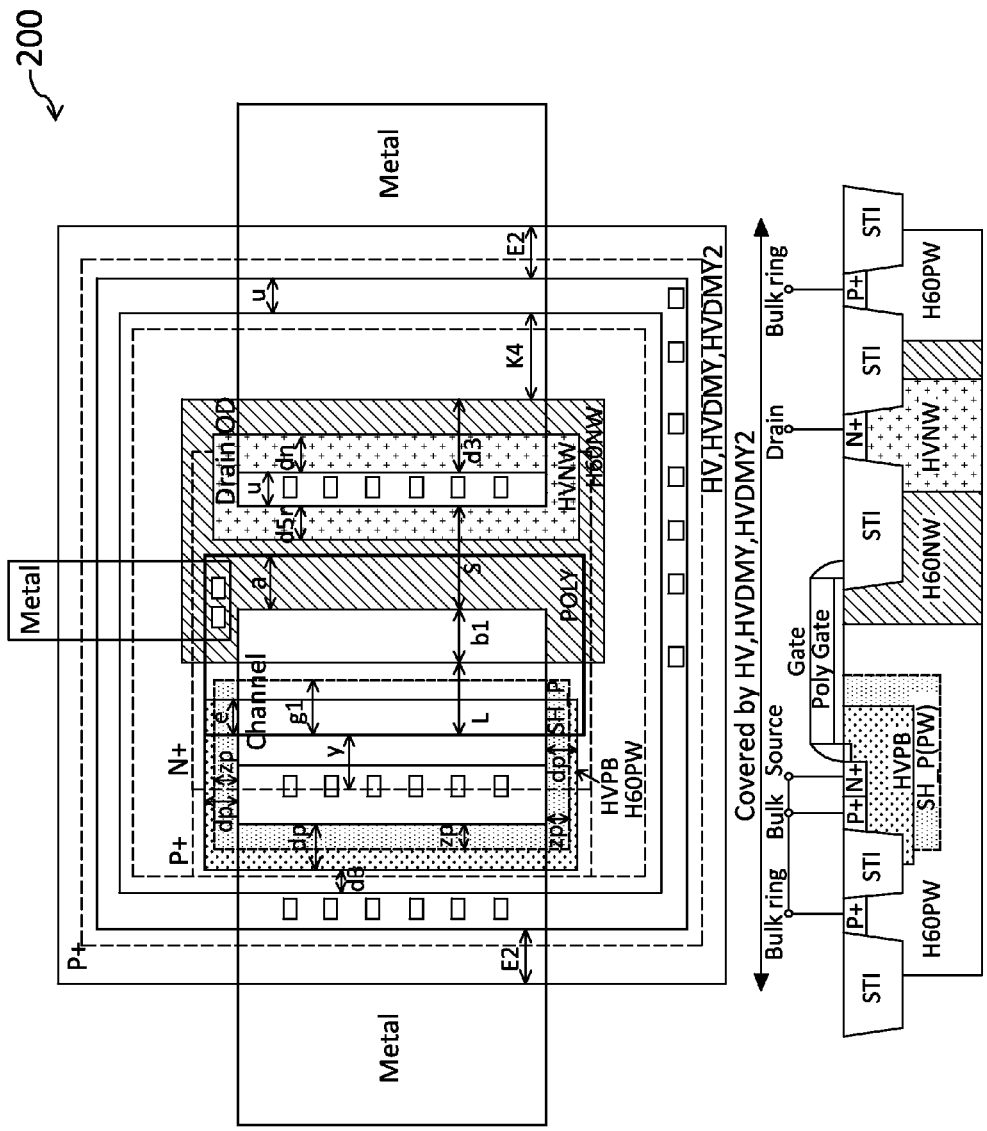
FIG. 2 is a graphical design system (GDS) file received from a device creator, in accordance with some embodiments.

FIG. 2 is a graphical design system (GDS) file 200 received from a device creator, in accordance with some embodiments. GDS file 200 is a non-limiting example of an input filed received in operation 102 (FIG. 1). GDS file 200 includes device specifications for a high-voltage (HV) transistor. The HV transistor of GDS file 200 includes several different features, such as doped wells, doped bodies, isolation features and a gate structure, where the feature is presented in a geometrical shape, e.g., polygon, onto a GDS with a specific layer name or a layer number. The features of GDS file 200 have different physical cross section structure, e.g., depths into a substrate of the HV transistor or heights above the substrate of the HV transistor. In some embodiments, a layer of GDS file 200 is defined based on the depth or the height of respective features. In some embodiments, a layer of GDS file 200 is defined based on a predetermined depth or height of the substrate of the HV transistor.

Returning to FIG. 1, method 100 continues with operation 104 in which features of the device are extracted from all layers of the input file. A feature is defined as a geometrical pattern, which can be composed of a single layer pattern or a logical operation of a plurality of layers, in which the layer is represented by a layer name or layer number. The features are extracted using a processor associated with a computing device. Extracting the features enables identification of the features by the computing device. In some embodiments, the features are extracted using an electronic design automation (EDA) tool. In some embodiments, the features include structures such as doped wells, doped bodies, gate structures, isolation structures, or other suitable device structures, all of which represent different fabrication parameters such as dopant types, dopant concentrations, or materials. In some embodiments, the features include a grouping of structures or layers.

In operation 106, a mini-tech file is generated based on relationships between the extracted features. The mini-tech file is generated by a computing device. In some embodiments, the mini-tech file is generated using the EDA tool. The mini-tech file enables identification of a device type for the input file.

The mini-tech file is generated using relationships between the extracted features. The relationships between the features are determined using logic operations and positional parameters. In some embodiments, the logic operations include Boolean logic operations. In some embodiments, the logic operations include AND operations, meaning two or more features are included in a same layer; OR operations, meaning at least one of two or more features are included in a same layer; NOT operations, meaning at least one feature is absent from a layer; BUT operations, meaning one feature is present in a layer and at least one other feature is absent from the same layer; or other suitable logic operations.

The positional parameters are used to determine a relative position of the features within a same layer of the device, in which the layer may be a primitive layer used in mask making or a derived layer from a logical operation of multiple layers. In some embodiments, the positional parameters include fully separated, meaning a separation distance exists between two analyzed features; separated but touching, meaning an interface exists between the two analyzed features, but the features do not overlap; overlapping, meaning at least a portion of a first feature is included in a same area as at least a portion of a second feature; enclosed, meaning that a first feature is surrounded by a second feature; or another suitable positional parameter. The combination of logic operations and positional parameters enables determination of the presence and position of different features within a certain layers.

In operation 108, layer set relationships are analyzed. A layer set represents a physically grouped layers, for forming a basic device structure, of a device among one to multiple devices onto a same input file (e.g. GDS). A layer set includes at least two layers, wherein the inclusion layer has at least one feature in that given layer which physically interacts with other layer feature in the same layer set. The layer set relationships include comparison of the presence and location of features in two distinct layers. In some embodiments, operation 108 is limited to analyzing adjacent layers. In some embodiments, operation 108 includes analysis of adjacent layers and non-adjacent layers, i.e., layers which are separated from one another by at least one other layer. Results from the layer set relationship analysis are stored in a non-transitory computer readable medium.

A device type is determined using the layer set relationships in operation 110. The device type is determined by comparing the analyzed layer set relationships with template layer set relationships. In some embodiments, the device type is determined using an EDA tool. In some embodiments, the device type is determined by comparing the layer set relationship from operation 108 with a device type database. In some embodiments, the device type is determined by comparing all analyzed layer set relationships with the template layer set relationships. In some embodiments, the device type is determined by comparing less than all analyzed layer set relationships from operation 108 with the template layer set relationships. In some embodiments, analyzed layer set relationships from operation 108 are compared with the template layer set relationships until the device type is determined and then comparisons are ceased. In some embodiments, the template layer set relationships include characteristic layer set relationships which are unique to a specific device type, where the characteristic layer set may refer to a single primitive layer identity or a derived layer identity from multiple layers. In some embodiments, comparisons are limited to the characteristic layer set relationships.

In operation 112, the mini-tech file is updated with device properties. The device properties are determined based on the layer set relationships analyzed in operation 108 and the computation results 114. In some embodiments, the device properties include computation results 114 of pattern width, length, and area, or another suitable device property. The mini-tech file is updated by incorporating the device properties with the device type. The mini-tech file is updated using a processor in a computing device.

A computation is performed on the updated mini-tech file in operation 114. The computation determines the dimensional and geometrical properties of the device. In some embodiments, the computation determines pattern width, length, and area, or other applicable dimensional and geometrical parameters. The device properties included in the mini-tech file in operation 112 are based on the layer set relationships analyzed in operation 108 and the computation results 114. By comparing the layer set relationships in the mini-tech file to the computation results, the device is able to be evaluated to determine the variety between layer sets. In some embodiments, the mini-tech file is updated by an iterative computations with modified device properties based on results of the computation by repeating operation 112. In some embodiments, operations 112 and 114 are repeated until all the device properties are obtained. In some embodiments, the computation is performed using a binary executable, a shell script, an EDA built-in call-back function, or another suitable software tools.

In operation 118, an output file is generated based on the device properties. The device properties are confirmed to meet the device specifications of device creator. The output file is generated to be readable by other design verification and quality assurance tools. In some embodiments, the output file is a text file. In some embodiments, the output file is a device physical property abstraction view, wherein a device physical property abstraction view describes the location and relative position of various features within a device may be a text file format, a compiled program data structure, or a specific EDA tool compliance format. The output file is stored on a non-transitory computer readable medium.

In operation 120, the output file is provided to design verification and quality assurance tools. In some embodiments, the design verification tools include a design rule check (DRC) tool, a layout versus schematic (LVS) tool, a process design kit (PDK), or other suitable device design tools. In some embodiments, the output file is provided to each design tool by a same computing device, such as an EDA tool. In some embodiments, the output file is provided to at least one design tool by a different computer device from a computing device used to provide the output file to a different design tool. In some embodiments, the output file is provided to a display to enable observation.

In comparison with manual analysis of an input file, method 100 decreases analysis time by increasing comparison rate for different features in different layers. Method 100 also increases the precision of input file analysis in comparison with manual analysis. Method 100 also provides a single output file or a plurality of abstraction views for use by several different design tools.

By providing an automated tool for identifying a type of device, method 100 enables a semiconductor manufacturer to determine whether a device designed by a device designer is properly defined in according design tools, e.g., DRC tools and LVS tools. In addition, by analyzing the input file using an automated tool, template layer relationships are updatable to enable faster analysis of future device revisions. Creating a customized device database for input files to manage the varieties and similarities between devices helps the semiconductor manufacturer to provide high quality product and accurate analysis for different customer orders.

Figure 3:
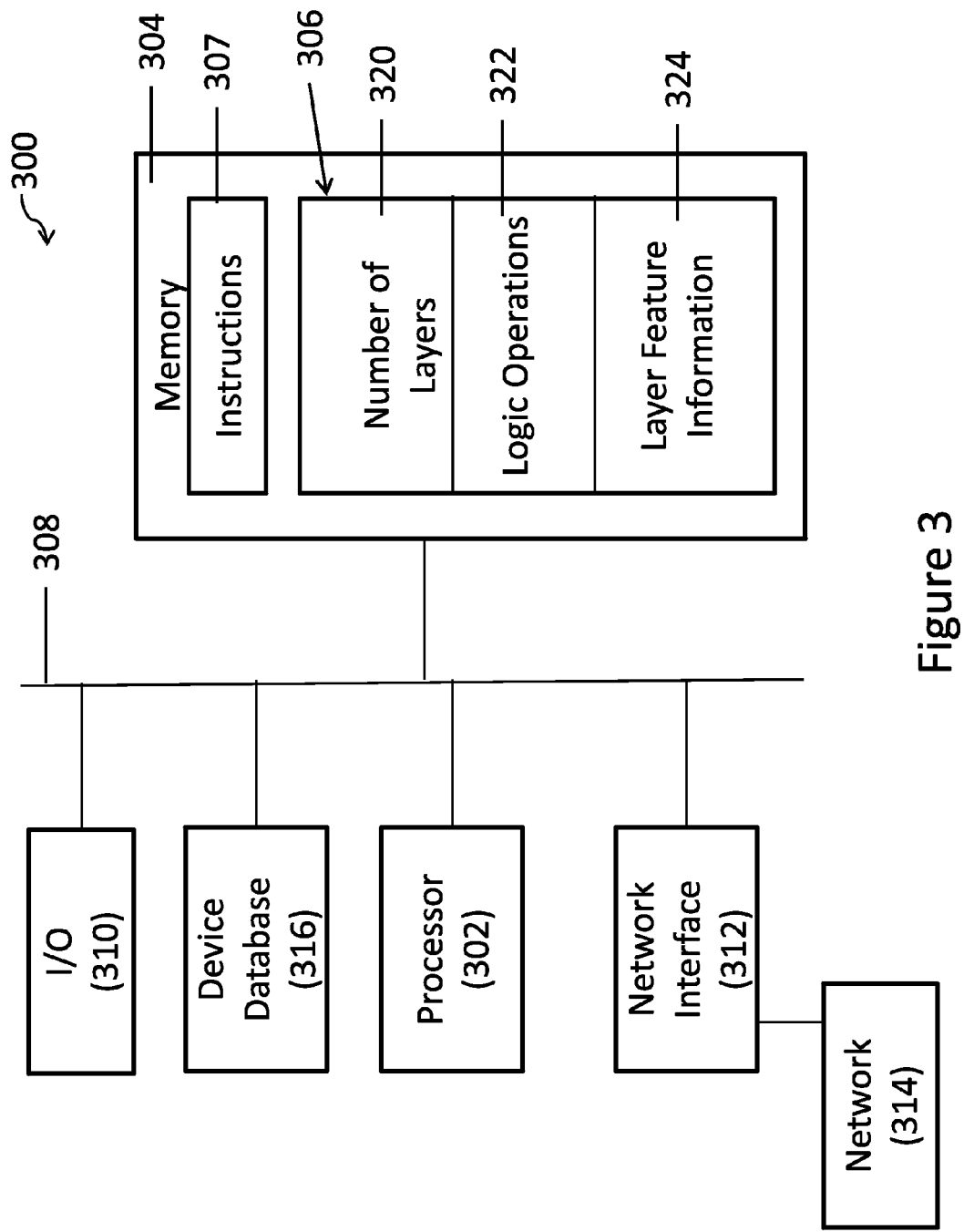
FIG. 3 is a block diagram of an electronic design automation (EDA) tool for implementing the method FIG. 1, in accordance with some embodiments.

FIG. 3 is a block diagram of an electronic design automation (EDA) tool for implementing the method FIG. 1, in accordance with some embodiments EDA tool 300 includes a hardware processor 302 and a non-transitory, computer readable storage medium 304 encoded with, i.e., storing, the computer program code 306, i.e., a set of executable instructions. Computer readable storage medium 304 is also encoded with instructions 307 for interfacing with operating system and other EDA API (application interface). The processor 302 is electrically coupled to the computer readable storage medium 304 via a bus 308. The processor 302 is also electrically coupled to an I/O interface 310 by bus 308. A network interface 312 is also electrically connected to the processor 302 via bus 308. Network interface 312 is connected to a network 314, so that processor 302 and computer readable storage medium 304 are capable of connecting to external elements via network 314. The processor 302 is configured to execute the computer program code 306 encoded in the computer readable storage medium 304 in order to cause system 300 to be usable for performing a portion or all of the operations as described in method 100. EDA tool 300 further includes a device database 316 configured to store template layer set relationships.

In some embodiments, the processor 302 is a central processing unit (CPU), a multi-processor, a distributed processing system, an application specific integrated circuit (ASIC), and/or a suitable processing unit.

In some embodiments, the computer readable storage medium 304 is an electronic, magnetic, optical, electromagnetic, infrared, and/or a semiconductor system (or apparatus or device). For example, the computer readable storage medium 304 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 304 includes a compact disk-read only memory (CD-ROM), a compact disk-read/write (CD-R/W), and/or a digital video disc (DVD).

In some embodiments, the storage medium 304 stores the computer program code 306 configured to cause system 300 to perform method 100. In some embodiments, the storage medium 304 also stores information needed for performing a method 100 as well as information generated during performing the method 100, such as a number of layers parameter 320, a logic operations parameter 322, a layer feature information parameter 324 and/or a set of executable instructions to perform the operation of method 100.

In some embodiments, the storage medium 304 stores instructions 307 for interfacing with operating system and other EDA API. The instructions 307 enable processor 302 to generate an output file readable by the design tools to effectively implement method 100 during a device design process.

EDA tool 300 includes I/O interface 310. I/O interface 310 is coupled to external circuitry. In some embodiments, I/O interface 310 includes a keyboard, keypad, mouse, trackball, trackpad, and/or cursor direction keys for communicating information and operations to processor 302.

EDA tool 300 also includes network interface 312 coupled to the processor 302. Network interface 312 allows EDA tool 300 to communicate with network 314, to which one or more other computer systems are connected. Network interface 312 includes wireless network interfaces such as BLUETOOTH, WIFI, WIMAX, GPRS, or WCDMA; or wired network interface such as ETHERNET, USB, or IEEE-1394. In some embodiments, method 100 is implemented in two or more EDA tools 300, and information such as layer feature, layer set relationships are exchanged between different EDA tools 300 via network 314.

Device database 316 is configured to store information about different devices in a computer readable format. Device database 316 is configured to store the template layer set relationships to enable comparison with new layer set relationships determined during method 100. In some embodiments, device database 316 is configured to be updated upon identification of a device type. In some embodiments, device database 316 is configured to be updated only when a new device type is identified by method 100. In some embodiments, device database 316 is associated with a single device. In some embodiments, device database 316 includes information related to more than one device.

EDA tool 300 is configured to receive an input file through I/O interface 310 or network interface 312. The information is transferred to processor 302 via bus 308 to determine a number of layers in the device. The number of layers is then stored in computer readable medium 304 as number of layers parameter 320. EDA tool 300 is configured to receive information related to logic operations to be executed during analysis of the input file through I/O interface 310 or network interface 312. The information is stored in computer readable medium 304 as logic command parameter 322. EDA tool 300 is configured to receive information related to layer feature information through I/O interface 310 or network interface 312. In some embodiments, the layer feature information is generated during method 100. The information is stored in computer readable medium 304 as layer feature information parameter 324.

During operation, processor 302 executes a set of instructions to determine a number of layers in a device based on the input file. Processor 302 then provides instructions for computer readable medium 304 to store the number of layers as number of layers parameter 320. Processor 302 also executes instructions for identifying layer feature information such as depth, height or relative position of a feature of the device. Processor 302 also executes instructions for comparing stored layer feature information parameter 324 with information stored in device database 316. In some embodiments, processor 302 is configured to receive instructions to perform analysis of the layer feature information using logic operations stored in logic operations parameter 322. In some embodiments, EDA tool 300 is configured to store logic operations parameter 324 for access by a separate design tool or computing device.

Figure 4:
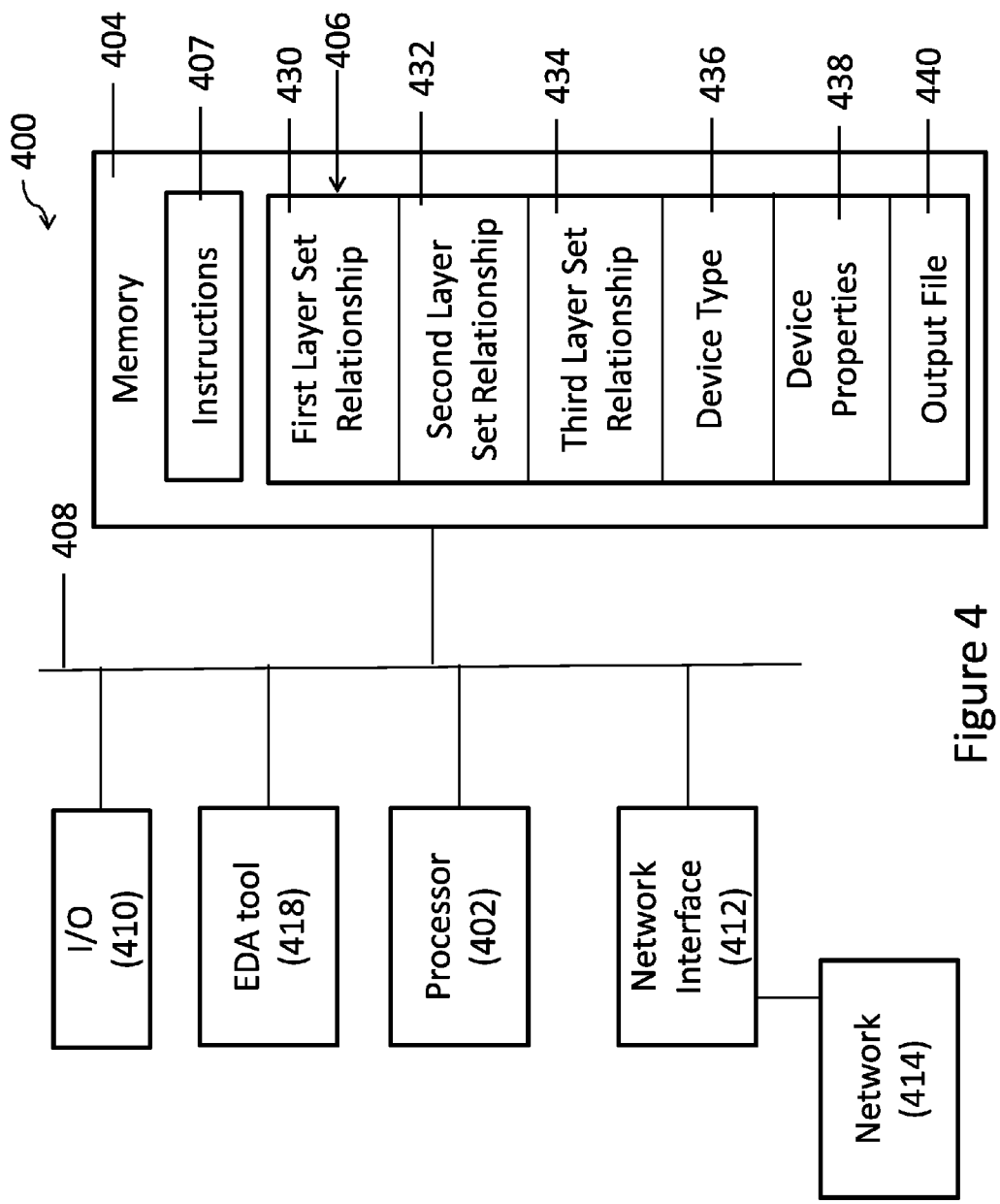
FIG. 4 is a block diagram of a general purpose computing device for implementing the method FIG. 1, in accordance with some embodiments.

FIG. 4 is a block diagram of a general purpose computing device 400 for implementing the method FIG. 1, in accordance with some embodiments. Computing device 400 includes several elements which are similar to elements within EDA tool 300. Similar elements have a same reference numeral increased by 100. In contrast to EDA tool 300, computing device 400 includes EDA tool 418. In some embodiments, EDA tool 418 is EDA tool 300. In some embodiments, EDA tool 418 is separate from EDA tool 300, and configured to perform similar functions as EDA tool 300.

Computer readable medium 404 is configured to store a first layer set relationship parameter 430, a second layer set relationship parameter 432, a third layer set relationship parameter 434, a device type parameter 436, a device properties parameter 438, and an output file parameter 440. Computing device 400 is configured to analyze an input file having three layers. First layer set relationship parameter 430 stores information relating to a comparison between features in a first layer and a second layer of the input file. Second layer set relationship parameter 432 stores information relating to a comparison between features in the first layer and a third layer of the input file. Third layer set relationship parameter 434 stores information relating to a comparison between features in the second layer and the third layer of the input file. One of ordinary skill in the art would recognize that an input file is able to have more or less than three layers and that a number of layer set relationship parameters is able to be changed based on a number of layers in the input file and a number of layers compared within a layer set, in some embodiments.

During operation, processor 402 executes a set of instructions to analyze feature information between the first layer and the second layer of the input file. In some embodiments, processor 402 accesses information stored in EDA tool 418 or a separate EDA tool, e.g., EDA tool 300 (FIG. 3), via I/O interface 410 or network interface 412 during in order to analyze feature information between the first layer and the second layer of the input file. Processor 402 executes instructions for storing results of the analysis of the feature information between the first layer and the second layer of the input file in first layer set relationship parameter 430. Processor 402 also executes a set of instructions to analyze information between the first layer and the third layer of the input file, as well as between the second layer and the third layer of the input file. Processor 402 executes instructions for storing results of the analysis of the feature information between the first layer and the third layer of the input file in second layer set relationship parameter 432. Processor 402 executes instructions for storing results of the analysis of the feature information between the second layer and the third layer of the input file in third layer set relationship parameter 434. In some embodiments, additional layer set relationships are analyzed which include more than two layers in at least one layer set.

Processor 402 executes a set of instructions to compare the results stored in first layer set relationship parameter 430, second layer set relationship parameter 432, and third layer set relationship parameter 434 with template layer set relationships. In some embodiments, the template layer set relationships are stored in EDA tool 418 in a device database, e.g., device database 316 (FIG. 3). In some embodiments, the template layer set relationships are stored in a separate server accessed through network interface 412. Based on results of the comparison, processor 402 determines a device type of the input file. Processor 402 is configured to store the results of the comparison in computer readable medium 404 as device type parameter 436. In some embodiments, processor 402 executes instructions for identifying a characteristic layer set relationship of the template layer set relationships and comparing the layer set relationship parameters with the characteristic layer set relationship. In some embodiments, processor 402 executes instructions for ceasing comparison with the template layer set relationships once a device type is determined. In some embodiments, processor 402 executes instructions for ceasing comparison with the template layer set relationships once a probability of a device type is above a pre-determined threshold value. In some embodiment, processor 402 executes instructions for comparing all layer set relationship parameters to the template layer set relationships.

Processor 402 further executes instructions to determine device properties. In some embodiments, processor 402 is configured to execute instructions for determining device parameters based on at least one of first layer set relationship parameter 430, second layer set relationship parameter 432, third layer set relationship parameter 434, device type parameter 436, or layer feature information. In some embodiments, the layer feature information is stored in EDA tool 418. In some embodiments, the layer feature information is stored in a separate EDA tool, e.g. EDA tool 300 (FIG. 3). In some embodiments, processor 402 is configured to receive the layer feature information via I/O interface 410 or network interface 412. Processor 402 executes instructions for storing the determined device properties in computer readable medium 404 as device properties parameter 438. In some embodiments, processor 402 executes instructions to perform a simulation of the device in the input file for comparison with device properties parameter 438 to determine whether the device properties parameter satisfies customer desires.

Processor 402 further executes instructions for generating an output file. In some embodiments, the output file is a text file which is readable by design tools such as LVS tools, DRC tools, PDK tools, or other suitable design tools. In some embodiments, the design tools are part of EDA tool 418. In some embodiments, the design tools are separate from computing device 400. In some embodiments, the output file is a device physical property abstraction view. In some embodiments, the output file is displayed to a circuit designer, a device creator, or a verification engineer. In some embodiments, the output file is editable based on manufacturing restrictions, customer requests, or other suitable criteria.

One aspect of this description relates to a method of determining a device type and device properties. The method includes receiving an input file, the input file comprising information related to a device. The method further includes identifying at least one layer set within the input file, the at least one layer set comprising a first layer and a second layer. The method further includes identifying at least one feature present in at least one of the first layer or the second layer. The method further includes analyzing, using a processor, a relationship of the at least one feature between the first layer and the second layer to determine at least one layer set relationship. The method further includes comparing the determined at least one layer set relationship with at least one template layer set relationship. The method further includes determining the device type of the device based on the comparison between the at least one layer set relationship and the at least one template layer set relationship. The method further includes determining the device properties of the device based on at least one of the at least one layer set relationship, the device type or the at least one feature.

Another aspect of this description relates to a system for determining a device type and device properties. The system includes a processor, and a computer readable medium connected to the processor. The processor is configured to execute instructions for identifying a plurality of layer sets within an input file, wherein the input file comprises information related to a device, and a layer set of the plurality of layer set comprising at least two layers. The processor is further configured to execute instructions for identifying at least one feature present in at least one layer a layer set of the plurality of layer sets. The processor is further configured to execute instructions for analyzing a relationship between the at least one feature formed by the first layer and at least one feature formed by the second layer to determine at least one layer set relationship. The processor is further configured to execute instructions for comparing at least one determined layer set relationship of the plurality of layer set relationships with at least one template layer set relationship. The processor is further configured to execute instructions for determining the device type of the device based on the comparison between the at least one layer set relationship of the plurality of layer set relationships and the at least one template layer set relationship. The processor is further configured to execute instructions for determining the device properties of the device based on at least one of the plurality of layer set relationships, the device type or the at least one feature.

Still another aspect of this description relates to a system for determining a device type and device properties. The system includes a processor, and an interface configured to receive an input file, the input file comprising information related to a device, wherein the interface is connected to the processor. The system further includes a device database configured to store at least one template layer set relationship, the at least one template layer set relationship associated with a known device time, wherein the device database is connected to the processor. The processor is configured to execute instructions for analyzing a relationship between the at least one feature formed by the first layer and at least one feature formed by the second layer to determine at least one layer set relationship. The processor is further configured to execute instructions for comparing the determined at least one layer set relationship with the at least one template layer set relationship. The processor is further configured to execute instructions for determining the device type of the device based on the comparison between the at least one layer set relationship and the at least one template layer set relationship. The processor is further configured to execute instructions for determining the device properties of the device based on at least one of the determined layer set relationship, the device type, the first feature or the second feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of determining a device type and device properties, the method comprising:
   receiving an input file, the input file comprising information related to a device;
   identifying at least one layer set within the input file, the at least one layer set comprising at least a first layer and a second layer, wherein the first layer is different from the second layer;
   identifying at least one feature present in at least one of the first layer or the second layer;
   analyzing, using a processor, a relationship between the at least one feature formed by the first layer and at least one feature formed by the second layer to determine at least one layer set relationship;
   comparing the determined at least one layer set relationship with at least one template layer set relationship;
   determining the device type of the device based on the comparison between the at least one layer set relationship and the at least one template layer set relationship; and
   determining the device properties of the device based on at least one of the at least one layer set relationship, the device type or the at least one feature, wherein the determined device properties help to increase a speed of analysis of the input file.

2. The method of claim 1, further comprising generating an output file based on the device type and the device properties, wherein the output file is readable by design tools.

3. The method of claim 2, wherein generating the output file comprises generating a text file.

4. The method of claim 1, wherein analyzing the relationship of the least one feature between the first layer and the second layer comprises:
   performing first operations to determine the presence and relative position of the at least one feature within the first layer;
   performing second operations to determine the presence and relative position of the at least one feature within the second layer; and
   combining results of the first operations with results of the second operations.

5. The method of claim 4, wherein performing the first operations comprises:
   determining whether the at least one feature is fully separated from a second feature present in at least one of the first layer or the second layer;
   determining whether the at least one feature is separate from the second feature, but touching the second feature;
   determining whether the at least one feature overlaps with the second feature;
   determining whether the at least one feature encloses the second feature; and
   determining whether the second feature encloses the at least one feature.

6. The method of claim 4, wherein performing the first operations comprises:
   performing Boolean logic operations to determine the presence of the at least one feature in the first layer and the second layer.

7. The method of claim 1, wherein comparing the determined at least one layer set relationship with at least one template layer set relationship comprises:
   comparing the at least one layer set relationship with the at least one template layer set relationship stored in a device database, wherein the at least one template layer set relationship is associated with a known device type.

8. The method of claim 1, wherein comparing the determined at least one layer set relationship with at least one template layer set relationship comprises:

identifying a characteristic template layer set relationship unique to a known device type; and comparing the at least one layer set relationship with the characteristic template layer set relationship.

9. The method of claim 1, wherein comparing the determined at least one layer set relationship with at least one template layer set relationship comprises:

comparing each layer set relationship of the at least one layer set relationship with each template layer set relationship of the at least one template layer set relationship.

10. The method of claim 1, wherein comparing the determined at least one layer set relationship with at least one template layer set relationship comprises:

ceasing comparing the at least one layer set relationship with the at least one template layer set relationship once the device type is identified.

11. The method of claim 1, wherein receiving the input file comprises receiving a graphics file.

12. The method of claim 11, wherein receiving the graphics file comprises receiving a graphical design system (GDS) file.

13. The method of claim 1, further comprising:

performing a simulation of the device in the input file;

comparing results of the simulation with the determined device properties.

14. The method of claim 1, further comprising displaying at least one of the device type or the device properties.

15. A system for determining a device type and device properties, the system comprising:

a processor; and a non-transitory computer readable medium connected to the processor, wherein the processor is configured to execute instructions for:

identifying a plurality of layer sets within an input file, wherein the input file comprises information related to a device, and a layer set of the plurality of layer sets comprising at least two layers, and the at least two layers are different from each other;

identifying at least one feature present in at least one layer a layer set of the plurality of layer sets;

analyzing a relationship between the at least one feature formed by the first layer and at least one feature formed by the second layer to determine at least one layer set relationship;

comparing at least one determined layer set relationship of the plurality of layer set relationships with at least one template layer set relationship;

determining the device type of the device based on the comparison between the at least one layer set relationship of the plurality of layer set relationships and the at least one template layer set relationship; and determining the device properties of the device based on at least one of the plurality of layer set relationships, the device type or the at least one feature, wherein the determined device properties help to increase a speed of analysis of the input file.

16. The system of claim 15, further comprising a device database configured to store the at least one template layer set relationship, wherein the device database is connected to at least one of the processor or the computer readable medium.

17. The system of claim 15, wherein the processor is configured to execute instructions to compare less than all layer set relationships of the plurality of layer set relationships with the at least one template layer set relationship.

18. The system of claim 15, further comprising an electronic design automation (EDA) tool configured to store each layer set relationship of the plurality of layer set relationships, and to determine a number of layers in the input file.

19. The system of claim 15, wherein the processor is configured to execute instructions for identifying at least one layer set of the plurality of layer sets, wherein at a first layer of the at least one layer set is separated from a second layer of the at least one layer set by a third layer.

20. A system for determining a device type and device properties, the system comprising:

a processor;

an interface configured to receive an input file, the input file comprising information related to a device having a plurality of layers, wherein the interface is connected to the processor; and a device database configured to store at least one template layer set relationship, the at least one template layer set relationship associated with a known device type, wherein the device database is connected to the processor, wherein the processor is configured to execute instructions for:

analyzing a relationship between the at least one feature formed by a first layer of the plurality of layers and at least one feature formed by a second layer of the plurality of layers to determine at least one layer set relationship, wherein the first layer is different from the second layer;

comparing the determined at least one layer set relationship with the at least one template layer set relationship;

determining the device type of the device based on the comparison between the at least one layer set relationship and the at least one template layer set relationship; and determining the device properties of the device based on at least one of the determined layer set relationship, the device type, the first feature or the second feature, wherein the determined device properties help to increase a speed of analysis of the input file.

* * * * *